US010998067B2

(12) United States Patent
Feng et al.

(10) Patent No.: US 10,998,067 B2
(45) Date of Patent: May 4, 2021

(54) SHIFT REGISTER, DRIVING METHOD THEREOF, GATE DRIVING CIRCUIT AND DISPLAY PANEL

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/811,766

(22) Filed: Mar. 6, 2020

(65) Prior Publication Data

US 2021/0065829 A1    Mar. 4, 2021

(30) Foreign Application Priority Data

Aug. 30, 2019    (CN) .......................... 201910818461.2

(51) Int. Cl.
*G09G 3/36* (2006.01)
*G11C 19/28* (2006.01)
(Continued)

(52) U.S. Cl.
CPC ......... *G11C 19/184* (2013.01); *G09G 3/3266* (2013.01); *G09G 3/3655* (2013.01);
(Continued)

(58) Field of Classification Search
CPC ............ G09G 3/3266; G09G 3/3677; G09G 2300/0408; G09G 2310/0286; G11C 19/184; G11C 19/28
See application file for complete search history.

(56) References Cited

U.S. PATENT DOCUMENTS 9,786,242 B2    10/2017 Dai
10,269,290 B2 *   4/2019 Shang .................... G11C 19/28
(Continued)

FOREIGN PATENT DOCUMENTS

CN    104299583 A    1/2015
CN    104700789 A    6/2015
(Continued)

OTHER PUBLICATIONS

First Chinese Office Action dated Jul. 29, 2020, for corresponding Chinese Application No. 201910818461.2.
(Continued)

*Primary Examiner* — Patrick O Neill
(74) *Attorney, Agent, or Firm* — Kinney & Lange, P.A.

(57) ABSTRACT

The embodiments of the present disclosure provide a shift register, a driving method thereof, a gate driving circuit, and a display panel. The shift register includes a plurality of shift register units and a first pulling-down circuit. Each shift register unit includes a first outputting circuit and a second outputting circuit. The first outputting circuit is coupled to a first outputting terminal of the shift register unit, and the second outputting circuit is coupled to a second outputting terminal of the shift register unit. The first outputting terminal of the shift register unit is coupled to the first pulling-down circuit via a first unidirectional isolating circuit, and the second outputting terminal of each shift register unit is coupled to the first pulling-down circuit via a second unidirectional isolating circuit, so that the first outputting terminal and the second outputting terminal of each shift register unit are isolated from each other.

14 Claims, 7 Drawing Sheets

(51) Int. Cl.
*G11C 19/18* (2006.01)
*G09G 3/3266* (2016.01)

(52) U.S. Cl.
CPC ......... *G09G 3/3674* (2013.01); *G09G 3/3677* (2013.01); *G11C 19/28* (2013.01); *G09G 2300/0408* (2013.01); *G09G 2310/0286* (2013.01)

(56) References Cited

U.S. PATENT DOCUMENTS

| | | | |
|---|---|---|---|
| 10,510,428 B2 * | 12/2019 | Wang | G11C 19/287 |
| 2007/0206409 A1 | 9/2007 | Choi et al. | |
| 2017/0116921 A1 | 4/2017 | Xiao et al. | |
| 2017/0236480 A1 | 8/2017 | Dai | |
| 2018/0336957 A1 | 11/2018 | Mi et al. | |
| 2020/0168162 A1 | 5/2020 | Feng et al. | |

FOREIGN PATENT DOCUMENTS

| | | |
|---|---|---|
| CN | 105405406 A | 3/2016 |
| CN | 106448607 A | 2/2017 |
| CN | 106548740 A | 3/2017 |
| CN | 106683624 A | 5/2017 |
| CN | 107452350 A | 12/2017 |
| CN | 109935185 A | 6/2019 |
| KR | 100791332 B1 | 1/2008 |

OTHER PUBLICATIONS

Second Chinese Office Action dated Feb. 19, 2021, received for corresponding Chinese Application No. 201910818461.2, 10 pages.

* cited by examiner

SHIFT REGISTER, DRIVING METHOD THEREOF, GATE DRIVING CIRCUIT AND DISPLAY PANEL

CROSS-REFERENCE TO RELATED APPLICATION(S)

This application claims the priority of Chinese Patent Application No. 201910818461.2 filed on Aug. 30, 2019, the entire contents of which are hereby incorporated by reference.

TECHNICAL FIELD

The present disclosure relates to a field of display technology. In particular, the present disclosure relates to a shift register, a driving method thereof, a gate driving circuit and a display panel.

BACKGROUND

A gate driving circuit may include a sensing unit, a scanning unit, and a connection unit configured to output a composite pulse from the both. However, such a circuit structure is complex and cannot meet the requirements for high resolution and narrow bezel.

SUMMARY

According to a first aspect of embodiments of the present disclosure, there is provided a shift register, comprising: a plurality of shift register units; and a first pulling-down circuit, wherein each of the plurality of shift register units comprises: a first outputting circuit electrically coupled to a first outputting terminal; a second outputting circuit electrically coupled to a second outputting terminal; a first unidirectional isolating circuit configured to connect the first outputting terminal with the first pulling-down circuit; and a second unidirectional isolating circuit configured to connect the second outputting terminal with the first pulling-down circuit, wherein the first unidirectional isolating circuit and the second unidirectional isolating circuit are configured such that the first outputting terminal and the second outputting terminal are electrically isolated from each other.

For example, the plurality of shift register units include a first shift register unit and a second shift register unit, wherein: the first outputting circuit of the first shift register unit is configured to control the first outputting terminal of the first shift register unit to output a first output signal according to a potential at a first pulling-up node and a first clock signal from a first clock terminal; and the second outputting circuit of the first shift register unit is configured to control the second outputting terminal of the first shift register unit to output a second output signal according to the potential at the first pulling-up node and a second clock signal from a second clock terminal; and the first outputting circuit of the second shift register unit is configured to control the first outputting terminal of the second shift register unit to output a third output signal according to a potential at a second pulling-up node and a third clock signal from a third clock terminal; and the second outputting circuit of the second shift register unit is configured to control the second outputting terminal of the second shift register unit to output a fourth output signal according to the potential at the second pulling-up node and a fourth clock signal from a fourth clock terminal.

For example, the first shift register unit further comprises a first controlling circuit configured to apply a first power supply voltage to a first pulling-down node, or pull down a potential at the first pulling-down node to a third power supply voltage, under a control of the potential at the first pulling-up node; and the second shift register unit further comprises a second controlling circuit configured to apply a second power supply voltage to a second pulling-down node, or pull down a potential at the second pulling-down node to the third power supply voltage, under a control of the potential at the second pulling-up node, wherein the first pulling-down circuit is electrically coupled to the first pulling-down node via a first controlling terminal, and electrically coupled to the second pulling-down node via a second controlling terminal.

For example, the first shift register unit further comprises a third pulling-down circuit configured to initialize the first pulling-up node under the control of the potential at the first pulling-down node and the potential at the second pulling-down node; and the second shift register unit further comprises a fourth pulling-down circuit configured to initialize the second pulling-up node under the control of the potential at the first pulling-down node and the potential at the second pulling-down node.

For example, the first power supply voltage and the second power supply voltage are applied alternatively.

For example, the first shift register unit further comprises: a cascaded outputting circuit and a second pulling-down circuit. The cascaded outputting circuit is configured to control a cascaded outputting terminal to output a cascaded output signal according to the potential at the first pulling-up node and a fifth clock signal from a fifth clock terminal. The second pulling-down circuit electrically coupled to the first pulling-down node via a third controlling terminal, and electrically coupled to the second pulling-down node via a fourth controlling terminal, wherein the second pulling-down circuit is configured to pull down the potential of the cascaded outputting terminal under the control of the potential at the first pulling-down node or the potential at the second pulling-down node.

For example, the first shift register unit further comprises: a first inputting circuit configured to apply a fourth power supply voltage to the first pulling-up node under a control of a first control signal from the first controlling terminal; and a first resetting circuit configured to reset the first pulling-up node with the third power supply voltage under a control of a second control signal from the second controlling terminal, and wherein the second shift register unit further comprises: a second inputting circuit configured to apply the fourth power supply voltage to the second pulling-up node under the control of the first control signal; and a second resetting circuit configured to reset the second pulling-up node with the third power supply voltage under the control of the second control signal.

For example, the first shift register unit further comprises a first sensing controlling circuit configured to apply, in a displaying mode, the fourth power supply voltage to a predetermined node, under a fifth control signal from a fifth controlling terminal, and control, in a sensing mode, the potential at the first pulling-up node according to the potential at the predetermined node and a third control signal from a third controlling terminal, so as to enable the first outputting circuit and the second outputting circuit of the first shift register unit to output a first sensing control signal and a second sensing control signal respectively; and wherein the second shift register unit further comprises a second sensing controlling circuit configured to control, in the sensing mode, the potential at the second pulling-up node according to the third control signal from the third controlling terminal, so as to enable the first outputting circuit and the second outputting circuit of the second shift register unit to output a third sensing control signal and a fourth sensing control signal respectively.

For example, the first pulling-down circuit comprises a first transistor and a second transistor, a first electrode of the first transistor and a first electrode of the second transistor being electrically coupled to the first unidirectional isolating circuit and the second unidirectional isolating circuit of each shift register unit, a second electrode of the first transistor being electrically coupled to a second electrode of the second transistor, a controlling electrode of a first transistor being electrically coupled to the first pulling-down node, and a controlling electrode of the second transistor being electrically coupled to the second pulling-down node.

For example, the first unidirectional isolating circuit comprises a third transistor, a first electrode of the third transistor being electrically coupled to a controlling electrode of the third transistor and the first outputting terminal of the shift register unit, and a second electrode of the third transistor being electrically coupled to the first pulling-down circuit; and the second unidirectional isolating circuit comprises a fourth transistor, a first electrode of the fourth transistor being electrically coupled to a controlling electrode of the fourth transistor and the second outputting terminal of the shift register unit, and a second electrode of the fourth transistor being electrically coupled to the first pulling-down circuit.

For example, the third pulling-down circuit comprises a seventh transistor and an eighth transistor, a first electrode of the seventh transistor being electrically coupled to a first electrode of the eighth transistor and the first pulling-up node, a second electrode of the seventh transistor being electrically coupled to a second electrode of the eighth transistor and a third power supply voltage terminal, a controlling electrode of the seventh transistor being electrically coupled to the first pulling-down node, and a controlling electrode of the eighth transistor being electrically coupled to the second pulling-down node; and the fourth pulling-down circuit comprises a ninth transistor and a tenth transistor, a first electrode of the ninth transistor being electrically coupled to a first electrode of the tenth transistor and the second pulling-up node, a second electrode of the ninth transistor being electrically coupled to a second electrode of the tenth transistor and the third power supply voltage terminal, a controlling electrode of the ninth transistor being electrically coupled to the first pulling-down node, and a controlling electrode of the tenth transistor being electrically coupled to the second pulling-down node.

For example, the second pulling-down circuit comprises an eleventh transistor and a twelfth transistor, a first electrode of the eleventh transistor being electrically coupled to a first electrode of the twelfth transistor and the cascaded outputting terminal, a second electrode of the eleventh transistor being electrically coupled to a second electrode of the twelfth transistor and a third power supply voltage terminal, a controlling electrode of the eleventh transistor being electrically coupled to the first pulling-down node, and a controlling electrode of the twelfth transistor being electrically coupled to the second pulling-down node.

According to a second aspect of the embodiments of the present disclosure, there is provided a gate driving circuit comprising a plurality of shift registers discussed in the aforementioned embodiments.

According to a third aspect of the embodiments of the present disclosure, there is provided a display panel comprising the gate driving circuit discussed in the aforementioned embodiments.

According to a fourth aspect of the embodiments of the present disclosure, there is provided a method for driving a shift register, in particular, for driving the shift register of the embodiments of the present disclosure. The method comprises: controlling each of the plurality of shift register units to output the first output signal via the first outputting terminal and the second output signal via the second outputting terminal respectively; and controlling the first pulling-down circuit to pull down the potential of the first outputting terminal and the potential of the second outputting terminal of each of the plurality of shift register units.

BRIEF DESCRIPTION OF THE DRAWINGS

The above and/or additional aspects and advantages of the present disclosure will become apparent and easily understood from the following description of the embodiments in conjunction with the accompanying drawings, in which.

DETAILED DESCRIPTION

Figure 1:
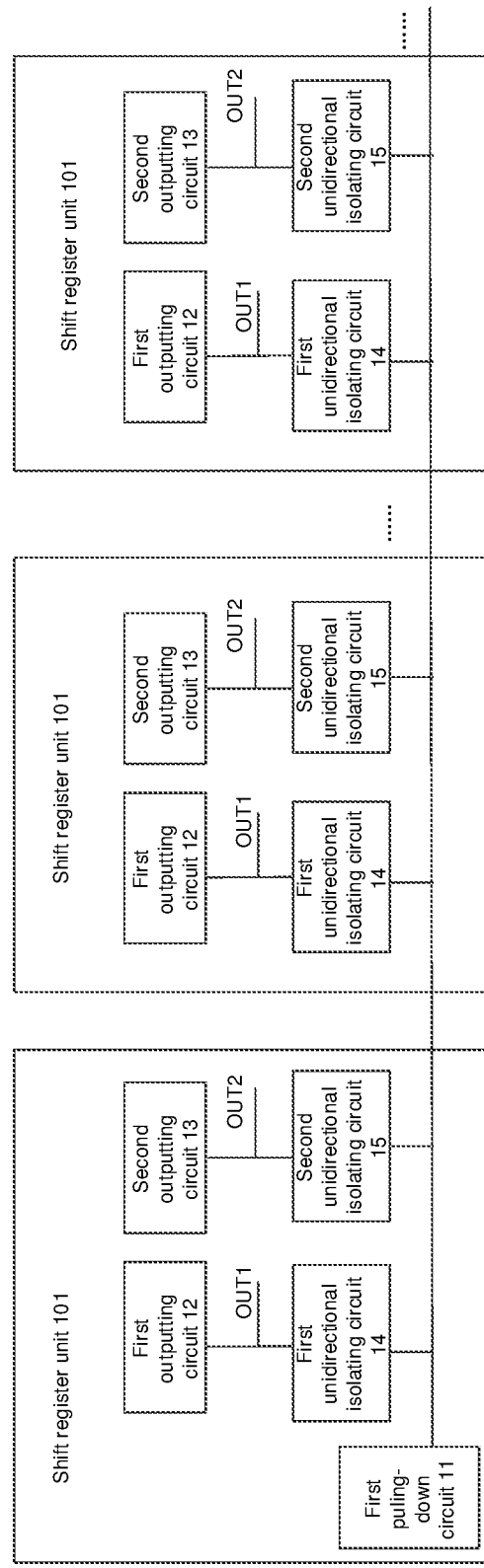
FIG. 1 shows a block diagram illustrating a shift register according to an embodiment of the present disclosure.

Hereinafter, embodiments of the present disclosure will be described in detail. Examples of the embodiments are shown in the accompanying drawings, wherein the same or similar reference numerals represent the same or similar elements or elements having the same or similar functions. The embodiments described below with reference to the drawings are exemplary, and are intended to explain the present disclosure, and should not be construed as limiting the present disclosure.

Hereinafter, a shift register, a driving method thereof, a gate driving circuit, and a display panel according to the embodiments of the present disclosure will be described with reference to the drawings.

FIG. 1 shows a block diagram illustrating a shift register according to an embodiment of the present disclosure As shown in FIG. 1, the shift register 100 comprises a plurality of shift register units 101 which share a first pulling-down circuit 11. Each of the plurality of shift register units 101 comprises: a first outputting circuit 12 electrically coupled to a first outputting terminal OUT1 of a corresponding shift register 101; a second outputting circuit 13 electrically coupled to a second outputting terminal OUT2 of a corresponding shift register 101. The first outputting terminal OUT1 of each shift register 101 is coupled to the first pulling-down circuit 11 via a first unidirectional isolating circuit 14, and the second outputting terminal OUT2 of each shift register 101 is coupled to the first pulling-down circuit 11 via a second unidirectional isolating circuit 15, such that the first outputting terminal OUT1 and the second outputting terminal OUT2 of each shift register 101 are electrically isolated from each other.

It should be noted that the first unidirectional isolating circuit 14 and the second unidirectional isolating circuit 15 can implement a unidirectional conduction. Specifically, there is a node M between the plurality of shift register units 101 and the first pulling-down circuit 11. When the potential at the first outputting terminal OUT1 is higher than the potential at the node M, the first unidirectional isolating circuit 14 and the first pulling-down circuit 11 are conducted, and when the potential at the first outputting terminal OUT1 is lower than the potential at the node M, the first unidirectional isolating circuit 14 is disconnected from the first pulling-down circuit 11 similarly. Similarly, when the potential at the second outputting terminal OUT2 is higher than the potential at the node M, the second unidirectional isolating circuit 15 and the first pulling-down circuit 11 are conducted, and when the potential at the second outputting terminal OUT2 is lower than the potential at the node M, the second unidirectional isolating circuit 15 is disconnected from the first pulling-down circuit 11.

It should also be noted that the pluraltiy of shift registers 100 are used to construct a gate driving circuit GOA. The pluraltiy of shift register units 101 in the shift register 100 may be located at different stages of the gate driving circuit, i.e., corresponding to rows of pixels in a circuit for driving pixels, respectively.

It can be understood that, in the embodiment of the present disclosure, the first outputting terminals OUT1 and the second outputting terminals OUT2 of the plurality of shift register units 101 may be respectively controlled for outputting. For example, the pluraltiy of shift register units 101 are sequentially controlled to output, and the first outputting terminal OUT1 and the second outputting terminal of each shift register unit 101 are enabled to output at a high potential. In addition, after the output of the plurality of shift register units 101 is completed, the first pulling-down circuit 11 may be controlled to pull down the potential at the first outputting terminal OUT1 and the potential at the second outputting terminal OUT2 of the plurality of shift register units 101. That is, the first outputting terminal OUT1 and the second outputting terminal OUT2 of the plurality of shift register units 101 are pulled down to a low potential by the first pulling-down circuit 11.

Therefore, in the shift register according to the embodiment of the present disclosure, the plurality of shift register units 101 can share the first pulling-down circuit 11, thereby simplifying the circuit structure, saving the occupied space, and meeting the requirements for the high-resolution and the narrow benzel.

In the following description, the shift register 100 comprising two shift register units 101 is taken as an example, but this is not a limitation on the protection scope of the present disclosure. Obviously, those skilled in the art can apply the present application to a case where the shift register 100 comprises three or more shift register units 101. Among them, as an example, the two shift register units 101 in the shift register 100 may be respectively located at an odd stage and an even stage, that is, corresponding to pixels in odd rows and pixels in even rows among the circuit for driving pixels, respectively.

Figure 2:
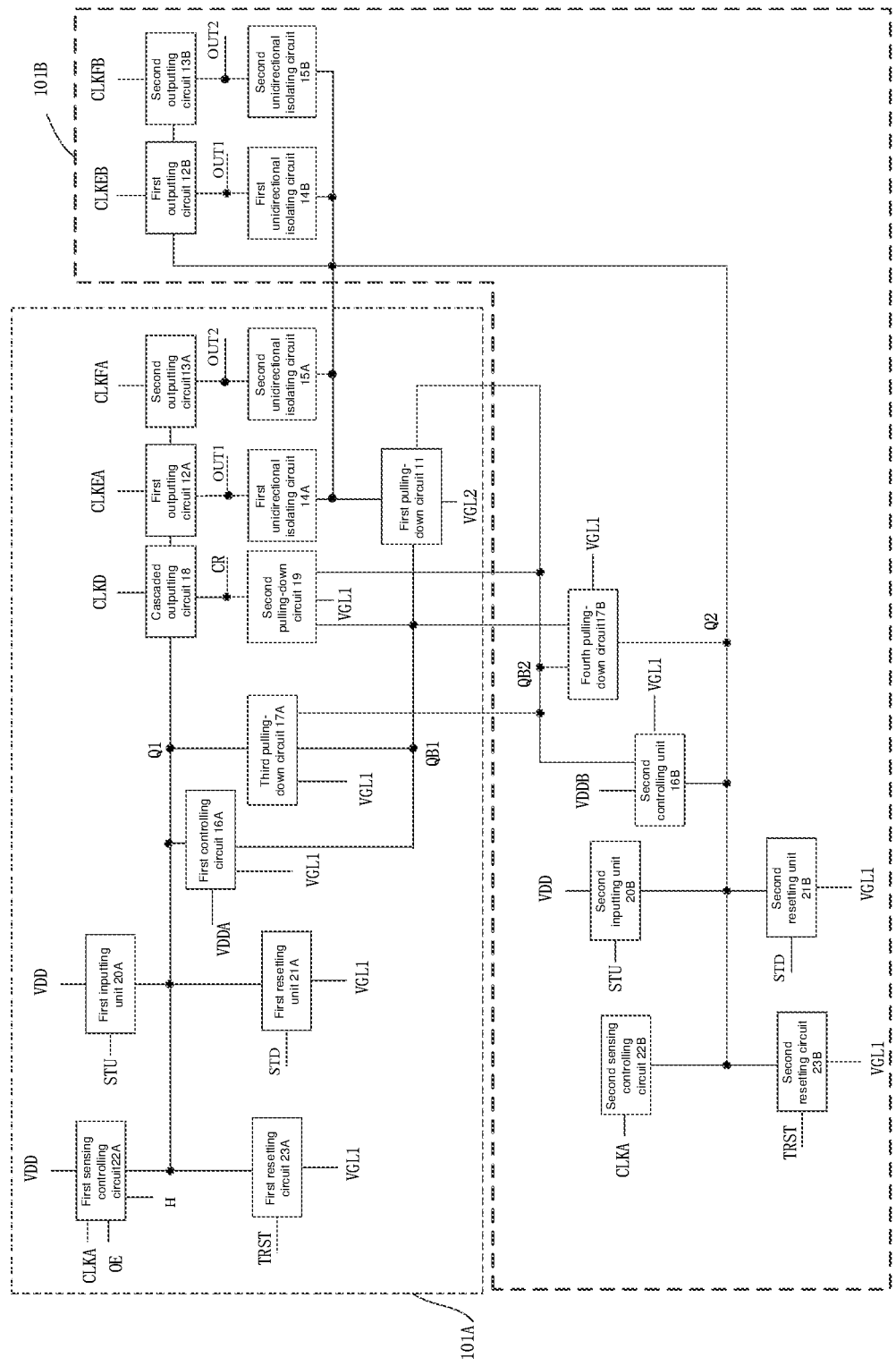
FIG. 2 shows a block diagram illustrating a shift register according to one embodiment of the present disclosure.

According to an embodiment of the present disclosure, as shown in FIG. 2, the plurality of shift register units 101 include a first shift register unit 101A and a second shift register unit 101B. The first outputting circuit 12A of the first shift register unit 101A is also electrically coupled to the first pulling-up node Q1 and a first clock terminal CLKEA, and is configured to control the first outputting terminal OUT1 of the first shift register unit 101A to output a first output signal according to the potential at the first pulling-up node Q1 and a first clock signal from the first clock terminal CLKEA. The second outputting circuit 13A of the first shift register unit 101A is also electrically coupled to the first pulling-up node Q1 and a second clock terminal CLKFA, and configured to control the second outputting terminal OUT2 of the first shift register unit 101A to output a second output signal according to the potential at the first pulling-up node Q1 and a second clock signal from the second clock terminal CLKFA. The first outputting circuit 12B of the second shift register unit 101B is also electrically coupled to the second pulling-up node Q2 and a third clock terminal CLKEB, and is configured to control the first outputting terminal OUT1 of the second shift register unit 101B to output a third output signal according to the potential at the second pulling-up node Q2 and a third clock signal from the third clock terminal CLKEB. The second outputting circuit 13B of the second shift register unit 101B is also electrically coupled to the second pulling-up node Q2 and a fourth clock terminal CLKFB, and configured to control the second outputting terminal OUT2 of the second shift register unit 101B to output a fourth output signal according to the potential at the second pulling-up node Q2 and a fourth clock signal from the fourth clock terminal CLKFB.

For example, when the first pulling-up node Q1 is at a high potential and the first clock signal provided by the first clock terminal CLKEA is at a high potential, the first outputting circuit 12A of the first shift register unit 101A implements the outputting, and the high potential provided by the first clock terminal CLKEA enables the first outputting terminal OUT1 of the first shift register unit 101A to output at a high potential. When the first pulling-up node Q1 is at a high potential and the second clock signal provided by the second clock terminal CLKFA is at a high potential, the second outputting circuit 13A of the first shift register unit 101A implements the outputting, and the high potential provided by the second clock terminal CLKFA enables the second outputting terminal OUT2 of the first shift register unit 101A to output at a high potential.

Similarly, when the second pulling-up node Q2 is at a high potential and the third clock signal provided by the third clock terminal CLKEB is at a high potential, the first outputting circuit 12B of the second shift register unit 101B implements the outputting, and the high potential provided by the third clock terminal CLKEB enables the first outputting terminal OUT1 of the second shift register unit 101B to output at a high potential. When the second pulling-up node Q2 is at a high potential and the fourth clock signal provided by the fourth clock terminal CLKFB is at a high potential, the second outputting circuit 13B of the second shift register unit 101B implements the outputting, and the high potential provided by the fourth clock terminal CLKFB enables the second outputting terminal OUT2 of the second shift register unit 101B to output at a high potential.

It should be noted that "high potential" and "low potential" in this document refer to two logic states indicating ranges of potential level at a certain circuit node, respectively. For example, the high potential at the first pulling-up node Q1 may specifically refer to a potential higher than the common terminal voltage, and the low potential at the first pulling-up node Q1 may specifically refer to a potential lower than the common terminal voltage. It can be understood that the specific potential level range can be set depending on the requirements of specific application scenarios, which is not limited in the disclosure.

Correspondingly, "pulling-up" used herein refers to raising the potential at the corresponding circuit node to a high potential, and "pulling-down" used herein refers to reducing the potential at the corresponding circuit node to a low potential. It can be understood that the above-mentioned "pulling-up" and "pulling-down" can both be achieved by a directional movement of electric charges, and therefore can be specifically implemented by electronic components with corresponding functions or a combination thereof, which is not limited in this disclosure.

Further, as shown in FIG. 2, the first shift register unit 101A further comprises a first controlling circuit 16A. The first controlling circuit 16A is electrically coupled to the first pulling-up node Q1, the first pulling-down node QB1, the first power supply voltage terminal VDDA, and the third power supply voltage terminal VGL1, respectively, and is configured to apply the first power supply voltage VDDA to the first pulling-down node QB1, or pull down the potential at the first pulling-down node QB1 to the third power supply voltage VGL1 under the control of the potential at the first pulling-up node Ql. The second shift register unit 101B further comprises a second controlling circuit 16B. The second controlling circuit 101B is electrically coupled to the second pulling-up node Q2, the second pulling-down node QB2, the second power supply voltage VDDB, and the third power supply voltage VGL1, respectively, and is configured to apply the second power supply voltage VDDB to the second pulling-down node QB2, or pull-down the potential at the second pulling-down node Q2 to the third power supply voltage VGL1, under the control of the potential at the second pulling-up node Q2. The first controlling terminal of the first pulling-down circuit 11 is electrically coupled to the first pulling-down node QB1, and the second controlling terminal of the first pulling-down circuit 11 is electrically coupled to the second pulling-down node QB2.

It should be noted that the first power supply voltage VDDA and the second power supply voltage VDDB may be alternately applied, so as to operate alternately. That is, at the same time, one and only one of the first power supply voltage VDDA and the second power supply voltage VDDB is at an effective potential. For example, when the first power supply voltage VDDA is high, the second power supply voltage VDDB is low, and when the first power supply voltage VDDA is low, the second power supply voltage VDDB is high. In addition, the third power supply voltage VGL1 may be at a low potential.

It can be understood that taking the first power supply voltage VDDA as a high potential as an example, the first power supply voltage VDDA is applied to the first pulling-down node QB1. When the first pulling-up node Q1 is at a high potential, the first controlling circuit 16A can pull down the potential at the first pulling-down node QB1 through the third power supply voltage VGL1, that is, pull down the potential at the first pulling-down node QB1 to the third power supply voltage VGL1 (low). When the first pulling-up node Q1 is at a low potential, the first controlling circuit 16A stops pulling down the potential at the first pulling-down node QB1, that is, the potential at the first pulling-down node QB1 remains at the potential of the first power supply voltage VDDA (high). At this time, since the second power supply voltage VDDB is at a low potential, the second pulling-down node QB2 is always at a low potential.

Similarly, taking the second power supply voltage VDDB as a high potential as an example, the second power supply voltage VDDB is applied to the second pulling-down node QB2. When the second pulling-up node Q2 is at a high potential, the second controlling circuit 16B can pull down the potential at the second pulling-down node QB2 through the third power supply voltage VGL1, that is, pull down the potential at the second pulling-down node QB2 to the third power supply voltage VGL1 (low). When the second pulling-up node Q2 is at a low potential, the second controlling circuit 16B stops pulling down the potential at the second pulling-down node QB2, that is, the potential at the second pulling-down node QB2 remains at the potential of the second power supply voltage VDDB (high). At this time, since the first power supply voltage VDDA is at a low potential, the first pulling-down node QB1 is always at a low potential.

Further, as shown in FIG. 2, the first shift register unit 101A may further include a third pulling-down circuit 17A. The third pulling-down circuit 17A is electrically coupled to the first pulling-down node Q1, the first pulling-down node QB1, and the second pulling-down node QB2, and is configured to initialize the first pulling-up node Q1 under the control of the potential at the first pulling-down node QB1 and the potential at the second pulling-down node QB2. The second shift register unit 101B further comprises a fourth pulling-down circuit 17B. The fourth pulling-down circuit 17B is electrically coupled to the second pulling-down node Q2, the first pulling-down node QB1, and the second pulling-down node QB2. The fourth pulling-down circuit 17B is configured to initialize the second pulling-up node QB2 under the control of the potential at the first pulling-down node QB1 or the potential at the second pulling-down node QB2.

It can be understood that when the first pulling-down node QB1 or the second pulling-down node QB2 is at a high potential, the third pulling-down circuit 17A of the first shift register unit 101A initializes the first pulling-up node Q1, that is, the potential at the first pulling-up node Q1 is pulled down to the third power supply voltage VGL1 (low). Similarly, when the first pulling-down node QB1 or the second pulling-down node QB2 is at a high potential, the fourth pulling-down circuit 17B of the second shift register unit 101B initializes the second pulling-up node Q2, that is, the potential at the second pulling-up node Q2 is pulled down to the third power supply voltage VGL1 (low).

Further, as shown in FIG. 2, the first shift register unit 101A further comprises a cascaded outputting circuit 18 and a second pulling-down circuit 19. The cascaded outputting circuit 18 is electrically coupled to a fifth clock terminal CLKD, the first pulling-up node Q1 and a cascaded outputting terminal CR, and is configured to control the cascaded outputting terminal CR to output a cascaded output signal according to the potential at the first pulling-up node Q1 and a fifth clock signal from the fifth clock terminal CLKD. The second pulling-down circuit 19 is electrically coupled to the cascaded outputting terminal CR, wherein the first controlling terminal of the second pulling-down circuit 19 is electrically coupled to the first pulling-down node QB1, and the second controlling terminal of the second pulling-down circuit 19 is electrically coupled to the second pulling-down node QB2. The second pulling-down circuit 19 is configured to pull down the potential at the cascaded outputting terminal CR under the control of the potential at the first pulling-down node QB1 or the potential at the second pulling-down node QB2.

It can be understood that when the first pulling-up node Q1 is at a high potential and the fifth clock signal provided by the fifth clock terminal CLKD is at a high potential, the cascaded outputting circuit 18 of the first shift register unit 101A implements the outputting, and the high potential provided by the fifth clock terminal CLKD enables the cascaded outputting terminal CR of the first shift register unit 101A to output at a high potential. In addition, when the first pulling-down node QB1 or the second pulling-down node QB2 is at a high potential, the second pulling-down circuit 19 of the first shift register unit 101A pulls down the cascaded outputting terminal CR, i.e pulls the potential of the cascaded outputting terminal CR to the third power supply voltage VGL1 (low).

Further, as shown in FIG. 2, the first shift register unit 101A further comprises a first inputting unit 20A and a first resetting unit 21A. The first inputting unit 20A is electrically coupled to the first pulling-up node Q1, the fourth power supply voltage terminal VDD and the first controlling terminal STU respectively, and is configured to apply a fourth power supply voltage VDD to the first pulling-up node Q1 under a control of a first control signal from the first controlling terminal STU. The first resetting unit 21A is electrically coupled to the first pulling-up node Q1, the third power supply VGL1, and the second controlling terminal STD, and configured to reset the first pulling-up node Q1 with the third power supply voltage VGL1 under the control of the second controlling signal from the second controlling terminal STD. The second shift register unit 101B further comprises a second inputting unit 20B and as second resetting unit 21B. The second resetting unit 21B is electrically coupled to the second pulling-up node Q2, the fourth voltage power supply voltage VDD and the first controlling terminal STU, and is configured to apply the fourth power supply voltage VDD to the second pulling-up node Q2 under the control of the first controlling signal from the first controlling terminal STU. The second resetting unit 21B is electrically coupled to the second pulling-up node Q1, the third power supply VGL1 and the second controlling terminal STD, and is configured to reset the second pulling-up node Q1 with the third power supply voltage VGL1 under the control of the second controlling signal from the second controlling signal terminal STD.

It can be understood that when the first control signal STU is at a high potential, the first inputting unit 20A of the first shift register unit 101A writes the fourth power supply voltage VDD of a high potential to the first pulling-up node Q1. At the same time, the second inputting unit 20B of the second shift register unit 101B applies the fourth power supply voltage VDD of the high potential to the second pulling-up node Q2. In addition, when the second control signal STD is high, the first resetting unit 21A of the first shift register unit 101A uses the third power supply voltage VGL1 to reset the first pulling-up node Q1, that is, the potential at the first pulling-up node Q1 is pulled down to the third power supply voltage VGL1 (low). At the same time, the second resetting unit 21B of the second shift register unit 101B uses the third power supply voltage VGL1 to reset the second pulling-up node Q2, that is, the potential at the second pulling-up node Q2 is pulled down to the third power supply voltage VGL1 (low).

Further, as shown in FIG. 2, the first shift register unit 101A further comprises a first sensing controlling circuit 22A. The first sensing controlling circuit 22A is electrically coupled to the first pulling-up node Q1, a predetermined node H, the third controlling terminal CLKA, a fifth controlling terminal OE, and the fourth power supply VDD respectively, and configured to apply, in a displaying mode, the fourth power supply voltage VDD to the predetermined node H, under a fifth control signal from a fifth controlling terminal OE, and control, in a sensing mode, the potential at the first pulling-up node Q1 according to the potential at the predetermined node H and a third control signal from a third controlling terminal CLKA, so as to enable the first outputting circuit 12A and the second outputting circuit 13A of the first shift register unit 101A to output a first sensing control signal and a second sensing control signal respectively. The second shift register unit 101B further comprises a second sensing controlling circuit 22B. The second sensing controlling circuit 22B is electrically coupled to the second pulling-up node Q2 and the third controlling terminal CLKA respectively, and configured to control, in the sensing mode, the potential at the second pulling-up node Q2 according to the third control signal from the third controlling terminal CLKA, so as to enable the first outputting circuit 12B and the second outputting circuit 13B of the second shift register unit 101B to output a third sensing control signal and a fourth sensing control signal respectively.

It can be understood that in the displaying mode, when the fifth controlling terminal OE is at a high potential, the first sensing controlling circuit 22A writes the fourth power supply voltage VDD of the high potential to the predetermined node H, and the predetermined node H remains at a high potential until it enters the sensing mode, wherein the sensing is performed during a blank phase (Blank phase) of the display device. In the sensing mode, the potential at the predetermined node H is high. When the third control signal from the third controlling terminal CLKA is high, the first sensing controlling circuit 22A applies the high potential to the first pulling-up node Q1 and the first pulling-up node Q2.

In addition, when the first clock signal provided by the first clock terminal CLKEA is high, the first outputting circuit 12A of the first shift register unit 101A enables the first outputting terminal OUT1 of the first shift register unit 101A to output the high potential of the first clock terminal CLKEA. When the second clock signal provided by the second clock terminal CLKFA is high, the second outputting circuit 13A of the first shift register unit 101A enables the second outputting terminal OUT2 of the first shift register unit 101A to output the high potential of the second clock terminal CLKFA. Similarly, when the third clock signal provided by the third clock terminal CLKEB is high, the first outputting circuit 12B of the second shift register unit 101B enables the first outputting terminal OUT1 of the second shift register unit 101B to output the high potential of the third clock terminal CLKEB. When the fourth clock signal provided by the fourth clock terminal CLKFB is high, the second outputting circuit 13B of the second shift register unit 101B enables the second outputting terminal OUT2 of the second shift register unit 101B to output the high potential of the fourth clock terminal CLKFB.

Further, as shown in FIG. 2, the first shift register unit 101A further comprises a first resetting circuit 23A. The first resetting circuit 23A is electrically coupled to the first pulling-up node Q1, the third power supply voltage VGL1, and the fourth controlling terminal TRST, and is configured to reset the first pulling-up node Q1 with the third power supply voltage VGL1 under the control of the fourth control signal from the fourth controlling terminal TRST. The second shift register unit 101B further comprises a second resetting circuit 23B. The second resetting circuit 23B is electrically coupled to the second pulling-up node Q2, the third power supply VGL1, and the fourth controlling terminal TRST, and configured to reset the second pulling-up node Q2 with the third power supply voltage VGL1 under the control of the fourth control signal from the fourth controlling terminal TRST.

It can be understood that when the fourth controlling terminal TRST is at a high level, the first resetting circuit 23A of the first shift register unit 101A uses the third power supply voltage VGL1 to reset the first pulling-up node Q1, i.e., pulls down the potential at the first pulling-up node Q1 to the third power supply voltage VGL1 (low). At the same time, the second resetting circuit 23B of the second shift register unit 101B uses the third power supply voltage VGL1 to reset the second pulling-up node Q2, i.e., pulls down the potential at the second pulling-up node Q2 to the third power supply VGL1 voltage (Low).

The specific circuits and working principles of the first shift register unit 101A and the second shift register unit 101B are described below with reference to FIGS. 3 and 4. Among them, in the following embodiments, the controlling electrode of the transistor is a gate, the first electrode of the transistor may be one of a source and a drain, and the second electrode of the transistor may be the other of the source and the drain. The transistor may be an N-type transistor or a P-type transistor, and the present disclosure uses the N-type transistor as an example for description. It will be apparent to those skilled in the art that the present disclosure can be applied to the P-type transistor. As an example, the transistor may be a thin film transistor TFT.

Figure 3:
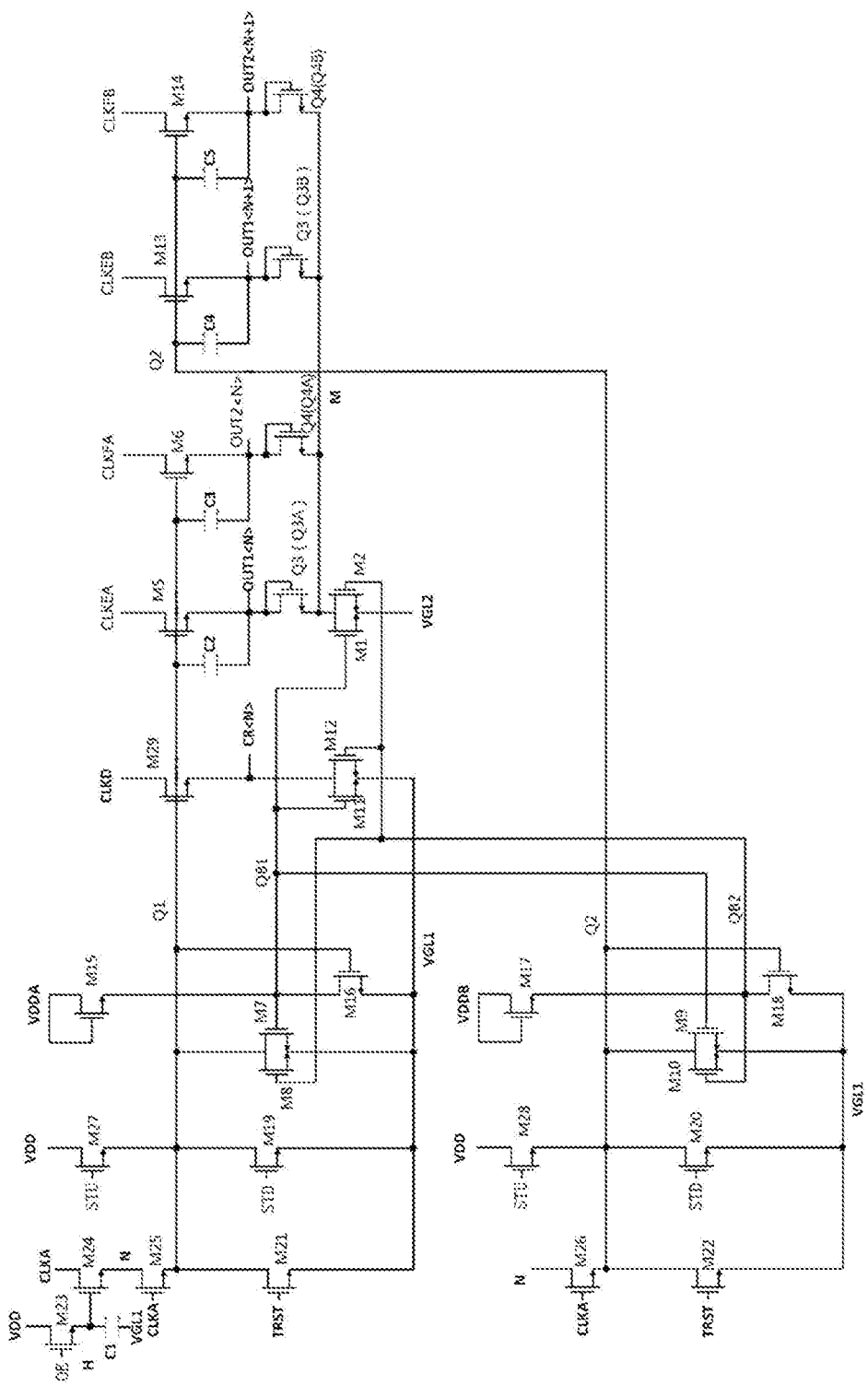
FIG. 3 shows a circuit schematic diagram illustrating the shift register according to one embodiment of the present disclosure.

According to the embodiment of FIG. 3, the first pulling-down circuit 11 comprises a first transistor M1 and a second transistor M2. The first electrode of the first transistor M1 is electrically coupled to the first electrode of the second transistor M2, both of which are electrically coupled to the first unidirectional isolating circuit 14 and the second unidirectional isolating circuit 15 of each shift register unit 101. The second electrode of the first transistor M1 is electrically coupled to the second electrode of the second transistor M2, both of which are electrically coupled to the fifth power supply voltage VGL2. The controlling electrode of the first transistor M1 is electrically coupled to the first pulling-down node QB1, and the controlling electrode of the second transistor M2 is electrically coupled to the second pulling-down node QB2.

It should be noted that the fifth power supply voltage VGL2 and the third power supply voltage VGL1 may be DC low-potential signals, and their values may be the same or different. For example, the potential at the fifth power supply voltage VGL2 may be higher than the potential at the third power supply voltage VGL1. The potential at the fifth power supply voltage VGL2 and the potential at the third power supply voltage VGL1 may both be at negative potentials. The fourth power supply voltage VDD is a DC high-potential signal.

It can be understood that when the first pulling-down node QB1 is at a high potential, the first transistor M1 is turned on. Since the unidirectional isolating circuits in the disclosure can enable an unidirectional conduction from an end electrically coupled with the outputting terminal to the other end electrically coupled with the first pulling-down circuit 11, the turning-on of the first transistor M1 can enable the pulling down of the potentials at the first outputting terminal OUT1 and the second outputting terminal OUT2 of each shift register unit 101 to a low potential as same as the third power supply voltage VGL1 by a corresponding unidirectional isolating circuit.

Therefore, the shift register according to the embodiment of the present disclosure can simplify the circuit structure by sharing he first pulling-down circuit 11, thereby saving the occupied space, and meeting the requirements for high resolution and narrow benzel.

According to an embodiment of the present disclosure, as shown in FIG. 3, the first unidirectional isolating circuit 14A and the first unidirectional isolating circuit 14B each include a third transistor Q3 (including a transistor Q3A and a transistor Q3B). The first electrode of the third transistor Q3 is electrically coupled to the controlling electrode and the first outputting terminal OUT1 of the corresponding shift register unit 101, and the second electrode of the third transistor Q3 is electrically coupled to the first pulling-down circuit 11. The second unidirectional isolating circuit 15A and the second unidirectional isolating circuit 15B each include a fourth transistor Q4 (including a transistor Q4A and a transistor Q4B). The first electrode of the fourth transistor Q4 is electrically coupled to the controlling electrode and the second outputting terminal OUT2 of the corresponding shift register unit 101, and the second electrode of the fourth transistor Q4 is electrically coupled to the first pulling-down circuit 11.

It can be understood that the first electrode of the third transistor Q3 is electrically coupled to the controlling electrode, thereby enabling the third transistor Q3 to be connected in a diode form. The first electrode of the fourth transistor Q4 is electrically coupled to the controlling electrode, thereby enabling the fourth transistor Q4 to be connected in a diode form. The second electrode of the third transistor Q3 and the second electrode of the fourth transistor Q4 are connected to a common node M. That is, the second electrode of the third transistor Q3 and the second electrode of the fourth transistor Q4 in the plurality of shift register units 101 are both connected to the common node M, wherein the common node M is electrically coupled to the first pulling-down circuit 11. Taking the first outputting terminal OUT1 and the second outputting terminal OUT2 of the first shift register unit 101A as an example, when the first outputting terminal OUT1 is at a high potential, since the second unidirectional isolating circuit 15A is reversly blocked, the output signal from the second outputting terminal OUT2 will not be affected by the first outputting terminal OUT1. When the second outputting terminal OUT2 is at a high potential, since the first unidirectional isolating circuit 14A is reversly blocked, the output signal from the first outputting terminal OUT1 will not be affected by the second outputting terminal OUT2.

Therefore, the sharing of the pulling-down tubes achieved by the grouping of the diode, and each outputting terminal can be output independently without affecting each other.

It should be noted that, for the implementation of the two shift register units, as shown in FIG. 3, the third transistor Q3 in the first shift register unit 101A is denoted as Q3A, and the fourth transistor Q4 in the first shift register unit 101A It is denoted as Q4A, and the third transistor Q3 in the second shift register unit 101B is denoted as Q3B, and the fourth transistor Q4 in the second shift register unit 101B is denoted as Q4B.

According to an embodiment of the present disclosure, as shown in FIG. 3, the third pulling-down circuit 17A may include a seventh transistor M7 and an eighth transistor M8. The first electrode of the seventh transistor M7 is electrically coupled to the first electrode of the eighth transistor M8 and the first pulling-up node Q1. The second electrode of the seventh transistor M7 is electrically coupled to the second electrode of the eighth transistor M8 and the third power supply voltage VGL1. The controlling electrode of the seventh transistor M7 is electrically coupled to the first pulling-down node QB1, and the controlling electrode of the eighth transistor M8 is electrically coupled to the second pulling-down node QB2. The fourth pulling-down circuit 17B comprises a ninth transistor M9 and a tenth transistor M10. The first electrode of the ninth transistor M9 is electrically coupled to the first electrode of the tenth transistor M10 and the second pulling-up node Q2. The second electrode of the ninth transistor M9 is electrically coupled to the second electrode of the tenth transistor M10 and the third power supply voltage VGL1. The controlling electrode of the ninth transistor M9 is electrically coupled to the first pulling-down node QB1, and the controlling electrode of the tenth transistor M10 is electrically coupled to the second pulling-down node QB2.

It can be understood that when the first pulling-down node QB1 is at a high potential, the seventh transistor M7 is turned on, and the potential at the first pulling-up node Q1 can be pulled down to a low potential of the third power supply voltage VGL1 by the seventh transistor M7. In addition, the ninth transistor M9 is turned on, and the potential at the second pulling-up node Q2 can be pulled down to a low potential of the third power supply voltage VGL1 by the ninth transistor M9. When the second pulling-down node QB2 is at a high potential, the eighth transistor M8 is turned on, and the potential at the first pulling-up node Q1 can be pulled down to a low potential of the third power supply voltage VGL1 through the eighth transistor M8. Further, the tenth transistor M10 is turned on, and the potential at the second pulling-up node Q2 can be pulled down to a low potential of the third power supply voltage VGL1 through the tenth transistor M10.

According to the embodiment of FIG. 3, the second pulling-down circuit 19 comprises an eleventh transistor M11 and a twelfth transistor M12. The first electrode of the eleventh transistor M11 is electrically coupled to the first electrode of the twelfth transistor M12 and the cascaded outputting terminal CR. The second electrode of the eleventh transistor M11 is electrically coupled to the second electrode of the twelfth transistor M12 and the third power supply voltage VGL1. The controlling electrode of the eleventh transistor M11 is electrically coupled to the first pulling-down node QB1, and the controlling electrode of the twelfth transistor M12 is electrically coupled to the second pulling-down node QB2.

It can be understood that when the first pulling-down node QB1 is at a high potential, the eleventh transistor M11 is turned on, and the potential at the cascaded outputting terminal CR can be pulled down to a low potential of the third power supply voltage VGL1 through the eleventh transistor M11. When the second pulling-down node QB2 is at a high potential, the twelfth transistor M12 is turned on, and the potential at the cascaded outputting terminal CR can be pulled down to a low potential of the third power supply voltage VGL1 through the twelfth transistor M12.

According to the embodiment of FIG. 3, the first outputting circuit 12A of the first shift register unit 101A comprises a fifth transistor M5 and a second capacitor C2. The first electrode of the fifth transistor M5 is electrically coupled to the first clock terminal CLKEA, the second electrode of the fifth transistor M5 is electrically coupled to the first outputting terminal OUT1 of the first shift register unit 101A, and the controlling electrode of the fifth transistor M5 is electrically coupled to the first pulling-up node Q1. A first terminal of the second capacitor C2 is electrically coupled to a controlling electrode of the fifth transistor M5, and a second terminal of the second capacitor C2 is electrically coupled to the second electrode of the fifth transistor M5. The second outputting circuit 13A of the first shift register unit 101A comprises a sixth transistor M6 and a third capacitor C3. The first electrode of the sixth transistor M6 is electrically coupled to the second clock terminal CLKFA, the second electrode of the sixth transistor M6 is electrically coupled to the second outputting terminal OUT2 of the first shift register unit 101A, and the controlling electrode of the sixth transistor M6 is electrically coupled to the first pulling-up node Q1. The first terminal of the third capacitor C3 is electrically coupled to the controlling electrode of the sixth transistor M6, and the second terminal of the third capacitor C3 is electrically coupled to the second electrode of the sixth transistor M6.

The first outputting circuit 12B of the second shift register unit 101B comprises a thirteenth transistor M13 and a fourth capacitor C4. The first electrode of the thirteenth transistor M13 is electrically coupled to the third clock terminal CLKEB, the second electrode of the thirteenth transistor M13 is electrically coupled to the first outputting terminal OUT1 of the second shift register unit 101B, and the controlling electrode of the thirteenth transistor M13 is electrically coupled to the second pulling-up node Q2. The first terminal of the fourth capacitor C4 is electrically coupled to the controlling electrode of the thirteenth transistor M13, and the second terminal of the fourth capacitor C4 is electrically coupled to the second electrode of the thirteenth transistor M13. The second outputting circuit 13B of the second shift register unit 101B comprises a fourteenth transistor M14 and a fifth capacitor C5. The first electrode of the fourteenth transistor M14 is electrically coupled to the fourth clock terminal CLKFB, the second electrode of the fourteenth transistor M14 is electrically coupled to the second outputting terminal OUT2 of the second shift register unit 101B, and the controlling electrode of the fourteenth transistor M14 is electrically coupled to the second pulling-up node Q2. The first terminal of the fifth capacitor C5 is electrically coupled to the controlling electrode of the fourteenth transistor M14, and the second terminal of the fifth capacitor C5 is electrically coupled to the second electrode of the fourteenth transistor M14.

It can be understood that when the first pulling-up node Q1 is at a high potential, the gates of the fifth transistor M5 and the sixth transistor M6 are set to a high potential. If the first clock terminal CLKEA is provided at a high potential, the first outputting terminal OUT1 of the first shift register unit 101A outputs at a high potential. If the second clock terminal CLKFA is provided at a high potential, the second outputting terminal OUT2 of the first shift register unit 101A outputs at a high potential. Similarly, when the second pulling-up node Q2 is at a high potential, the gates of the thirteenth transistor M13 and the fourteenth transistor M14 are set to a high potential. If the third clock terminal CLKEB is provided at a high potential, the first outputting terminal OUT1 of the second shift register unit 101B outputs at a high potential. If the fourth clock terminal CLKFB is provided at a high potential, the second outputting terminal OUT2 of the second shift register unit 101B outputs at a high potential.

According to the embodiment of FIG. 3, the first controlling circuit 16A of the first shift register unit 101A comprises a fifteenth transistor M15 and a sixteenth transistor M16. The first electrode of the fifteenth transistor M15 is electrically coupled to the controlling electrode and the first power supply VDDA, and the second electrode of the fifteenth transistor M15 is electrically coupled to the first pulling-down node QB1. The gate of the sixteenth transistor M16 is electrically coupled to the first pulling-up node Q1, the first electrode of the sixteenth transistor M16 is electrically coupled to the third power supply VGL1, and the second electrode of the sixteenth transistor M16 is electrically coupled to the first pulling-down node QB1. The second controlling circuit 16B of the second shift register unit 101B comprises a seventeenth transistor M17 and an eighteenth transistor M18. The first electrode of the seventeenth transistor M17 is electrically coupled to the controlling electrode and the second power supply VDDB, and the second electrode of the seventeenth transistor M17 is electrically coupled to the second pulling-down node QB2. The gate of the eighteenth transistor M18 is electrically coupled to the second pulling-up node Q2, the first electrode of the eighteenth transistor M18 is electrically coupled to the third power supply VGL1, and the second electrode of the eighteenth transistor M18 is electrically coupled to the second pulling-down node QB2.

It can be understood that when the second power supply voltage VDDB is at a high potential, the first power supply voltage VDDA is at a low potential. At this time, the fifteenth transistor M15 is turned off, and the seventeenth transistor M17 is turned on. At this time, if the second pulling-up node Q2 is at a high potential, the eighteenth transistor M18 is turned on, and the potential at the second pulling-down node QB2 is pulled down to a low potential of the third power supply voltage VGL1. If the second pulling-up node Q2 is at a low potential, the second controlling circuit 16B stops pulling down the potential at the second pulling-down node QB2. That is, the potential at the second pulling-down node QB2 remains at the high potential of the second power supply voltage VDDB.

Specifically, according to the embodiment of FIG. 3, the cascaded outputting circuit 18 comprises a twenty-ninth transistor M29, wherein the first electrode of the twenty-ninth transistor M29 is electrically coupled to the fifth clock terminal CLKD, and the second electrode of twenty-ninth transistor M29 is electrically coupled to the cascaded outputting terminal CR, and the controlling electrode of the twenty-ninth transistor M29 is electrically coupled to the first pulling-up node Q1.

It can be understood that when the first pulling-up node Q1 is at a high potential, the gate of the twenty-ninth transistor M29 is set to a high potential, and then the high potential provided by the fifth clock terminal CLKD can enable the cascaded outputting terminal CR of the first shift register unit 101A to output at a high potential.

Specifically, according to the embodiment of FIG. 3, the first inputting unit 20A of the first shift register unit 101A comprises a twenty-seventh transistor M27. The first electrode of the twenty-seventh transistor M27 is electrically coupled to the fourth power supply voltage VDD, the second electrode of the twenty-seventh transistor M27 is electrically coupled to the first pulling-up node Q1, and the controlling electrode of the twenty-seventh transistor M27 is electrically coupled to the first controlling terminal STU. The first resetting unit 21A of the first shift register unit 101A comprises a nineteenth transistor M19. The first electrode of the nineteenth transistor M19 is electrically coupled to the first pulling-up node Q1, the second electrode of the nineteenth transistor M19 is electrically coupled to the third power supply voltage VGL1, and the controlling electrode of the nineteenth transistor M19 is electrically coupled to the second controlling terminal STD.

The second inputting unit 20B of the second shift register unit 101B comprises a twenty-eighth transistor M28. The first electrode of the twenty-eighth transistor M28 is electrically coupled to the fourth power supply voltage VDD, the second electrode of the twenty-eighth transistor M28 is electrically coupled to the second pulling-up node Q2, and the controlling electrode of the twenty-eighth transistor M28 is electrically coupled to the first controlling terminal STU. The second resetting unit 21B of the second shift register unit 101B comprises a twentieth transistor M20. The first electrode of the twentieth transistor M20 is electrically coupled to the second pulling-up node Q2, the second electrode of the twentieth transistor M20 is electrically coupled to the third power supply voltages VGL1, and the controlling electrode of the twentieth transistor M20 is electrically coupled to the second controlling terminal STD.

It can be understood that when the first controlling terminal STU is at a high potential, the twenty-seventh transistor M27 and the twenty-eighth transistor M28 are turned on, the high potential of the fourth power supply voltage VDD is written into the first pulling-up node Q1, and the second pulling-up node Q2. In addition, when the second controlling terminal STD is at a high potential, the nineteenth transistor M19 and the twentieth transistor M20 are turned on, and the potentials at the first pulling-up node Q1 and the second pulling-up node Q2 are pulled down to the low potential of third power supply voltage VGL1.

It should be noted that the first controlling terminal STU may be electrically coupled to the cascaded outputting terminal of the shift register unit in the previous fourth stage from the first shift register unit, based on the number of stage of the first shift register unit. That is, assuming that the number of stage of the first shift register unit is the $N^{th}$ stage, the first controlling terminal STU can be electrically coupled to the cascaded outputting terminal of the shift register unit in the $(N-4)^{th}$ stage. Further, the second controlling terminal STD may be electrically coupled to the cascaded outputting terminal of the shift register unit in the subsequent eighth stage from the first shift register unit, based on the number of stage of the first shift register unit. That is, assuming that the number of stage of the first shift register unit is the $N^{th}$ stage, the second controlling terminal STD can be electrically coupled to the cascaded outputting terminal of the shift register unit in the $(N+8)^{th}$ stage.

Specifically, according to the embodiment of FIG. 3, the first resetting circuit 23A of the first shift register unit 101A comprises a twenty-first transistor M21. The first electrode of the twenty-first transistor M21 is electrically coupled to the first pulling-up node Q1, the second electrode of the twenty-first transistor M21 is electrically coupled to the third power supply voltage VGL1, and the controlling electrode of the twenty-first transistor M21 is electrically coupled to the fourth controlling terminal TRST. The second resetting circuit 23B of the second shift register unit 101B comprises a twenty-second transistor M22. The first electrode of the twenty-second transistor M22 is electrically coupled to the second pulling-up node Q2, the second electrode is electrically coupled to the third power supply voltage VGL1, and the controlling electrode of the twenty-second transistor M22 is electrically coupled to the fourth controlling terminal TRST.

It can be understood that when the fourth controlling terminal TRST is at a high potential, the twenty-first transistor M21 and the twenty-second transistor M22 are turned on. The potentials at third pulling-up node Q1 and the second pulling-up node Q2 are reset with the third power supply voltage VGL1. That is, the potentials at third pulling-up node Q1 and the second pulling-up node Q2 are pulled down to the low potential of the third power supply voltage VGL1.

Specifically, according to the embodiment of FIG. 3, the first shift register unit 101A further comprises a first sensing controlling circuit 22A. The first sensing controlling circuit 22A comprises a twenty-third transistor M23, a twenty-fourth transistor M24, a twenty-five transistor M25 and first capacitor C1. The first electrode of the twenty-third transistor M23 is electrically coupled to the fourth power supply VDD, the second electrode of the twenty-third transistor M23 is electrically coupled to the predetermined node H, and the controlling electrode of the twenty-third transistor M23 is electrically coupled to the fifth controlling terminal OE. The first electrode of the twenty-fourth transistor M24 is electrically coupled to the third controlling terminal CLKA, the second electrode of the twenty-fourth transistor M24 is electrically coupled to the node N, and the controlling electrode of the twenty-fourth transistor M24 is electrically coupled to the pre-stored node H. The first electrode of the twenty-fifth transistor M25 is electrically coupled to the node N, the second electrode of the twenty-fifth transistor M25 is electrically coupled to the first pulling-up node Q1, and the controlling electrode of the twenty-fifth transistor M25 is electrically coupled to the third controlling terminal CLKA. One terminal of the first capacitor C1 is electrically coupled to the pre-stored node H, and the other terminal of the first capacitor C1 is electrically coupled to the third power supply VGL1.

The second sensing controlling circuit 22B comprises a twenty-sixth transistor M26. The first electrode of the twenty-sixth transistor M26 is electrically coupled to the node N, the second electrode of the twenty-sixth transistor M26 is electrically coupled to the second pulling-up node Q2, and the controlling electrode of the twenty-sixth transistor M26 is electrically coupled to the third controlling terminal CLKA.

It can be understood that in the displaying mode, when the fifth controlling terminal OE is at a high potential, the twenty-third transistor M23 is turned on, and the high potential of the fourth power supply voltage VDD is written into the predetermined node H. With the first capacitor C1, the predetermined node H is kept at a high potential until it enters to the sensing mode, wherein the sensing is performed in a blank phase (Blank phase) of the display device.

In the sensing mode, the potential at the predetermined node H is high, and the twenty-fourth transistor M24 is turned on. When the third controlling terminal CLKA is at a high potential, the twenty-fifth transistor M25 and the twenty-sixth transistor M26 are turned on. Thus, the high potential of the third controlling terminal CLKA is applied to the first pulling-up node Q1 through the twenty-fourth transistor M24 and the twenty-fifth transistor M25, and applied to the second pulling-up node Q2 through the twenty-fourth transistor M24 and the twenty-sixth transistor M26. At this time, the outputting terminals of the first shift register unit 101A and the second shift register unit 101B may output a sensing signal according to a clock terminal.

As a result, random sensing can be achieved, that is, being capable of compensating the threshold voltage of the driving transistor for any row of pixels in any frame.

It should be noted that the fifth controlling terminal OE can receive the same signal as the first controlling terminal STU. That is, the fifth controlling terminal OE may be used as the cascaded outputting terminal of the shift register unit in the previous fourth stage from the first shift register unit, based on the number of stage of the first shift register unit. The third controlling terminal CLKA and the fourth controlling terminal TRST can be clock signals generated by an external controlling circuit.

Next, the working process of the shift register according to the embodiment of the present disclosure will be described with reference to FIGS. 3 and 4.

It should be noted that the third control signal from the third controlling terminal CLKA, the fifth clock signal from the fifth clock terminal CLKD, the first clock signal from the first clock terminal CLKEA, the second clock signal from the second clock terminal CLKFA, the third clock signal from the three clock terminal CLKEB, the fourth clock signal from the fourth clock terminal CLKFB, and the fourth control signal from the fourth controlling terminal TRST are all externally controlled clock signals. VDDA and VDDB are low frequency clock signals (can also be replaced by DC signals). Among them, the pulse width relationship among the previously provided clock signals is adjustable.

Specifically, the display panel may have 10 CLKE clock signals, that is, CLKE_1, CLKE_2, CLKE_3, CLKE_4, CLKE_5, . . . , CLKE_10. The aforementioned 10 CLKE clock signals may be provided to the shift register units in the first to tenth stage, respectively. For example, CLKE_1 is provided to the first clock terminal CLKEA of the shift register unit in the first stage, CLKE_2 is provided to the third clock terminal CLKEB of the shift register unit in the second stage, CLKE_3 is provided to the first clock terminal CLKEA of the shift register unit in the third stage, CLKE_4 is provided to the third clock terminal CLKEB of the shift register unit in the fourth stage, and so on. CLKE_1~CLKE_10 are repeated from the $10^{th}$ row. For example, CLKE_1 is provided to the first clock terminal CLKEA of the shift register unit in the eleventh stage, and CLKE_2 is provided to the third clock terminal CLKEB of the shift register unit in the eleventh stage, wherein CLKF and CLKE use the same clock signal.

First, the first pulling-up node Q1 and the second pulling-up node Q2 of all the shift registers in the gate driving circuit are reset. Specifically, the fourth controlling terminal TRST is at a high potential, the twenty-first transistor M21 and the twenty-second transistor M22 are turned on, and the potentials at the first pulling-up node Q1 and the second pulling-up node Q2 are pulled down to the low potential of the third power supply voltage VGL1 by the third power supply VGL1.

Next, in the displaying mode, that is, during the display of a certain frame, for the shift register unit in the $11^{th}$ stage and the shift register unit in the $12^{th}$ stage, the specific working process is as follows.

In the phase A, one of VDDA and VDDB is always maintained at a high potential and the other is at a low potential. For example, VDDB is maintained at a high potential and VDDA is maintained at a low potential. At this time, the seventeenth transistor M17 and the tenth transistor M10 are turned on, so that the second pulling-down node QB2 is at a high potential, and the first pulling-up node Q1 and the second pulling-up node Q2 are at a low potential.

Figure 4:
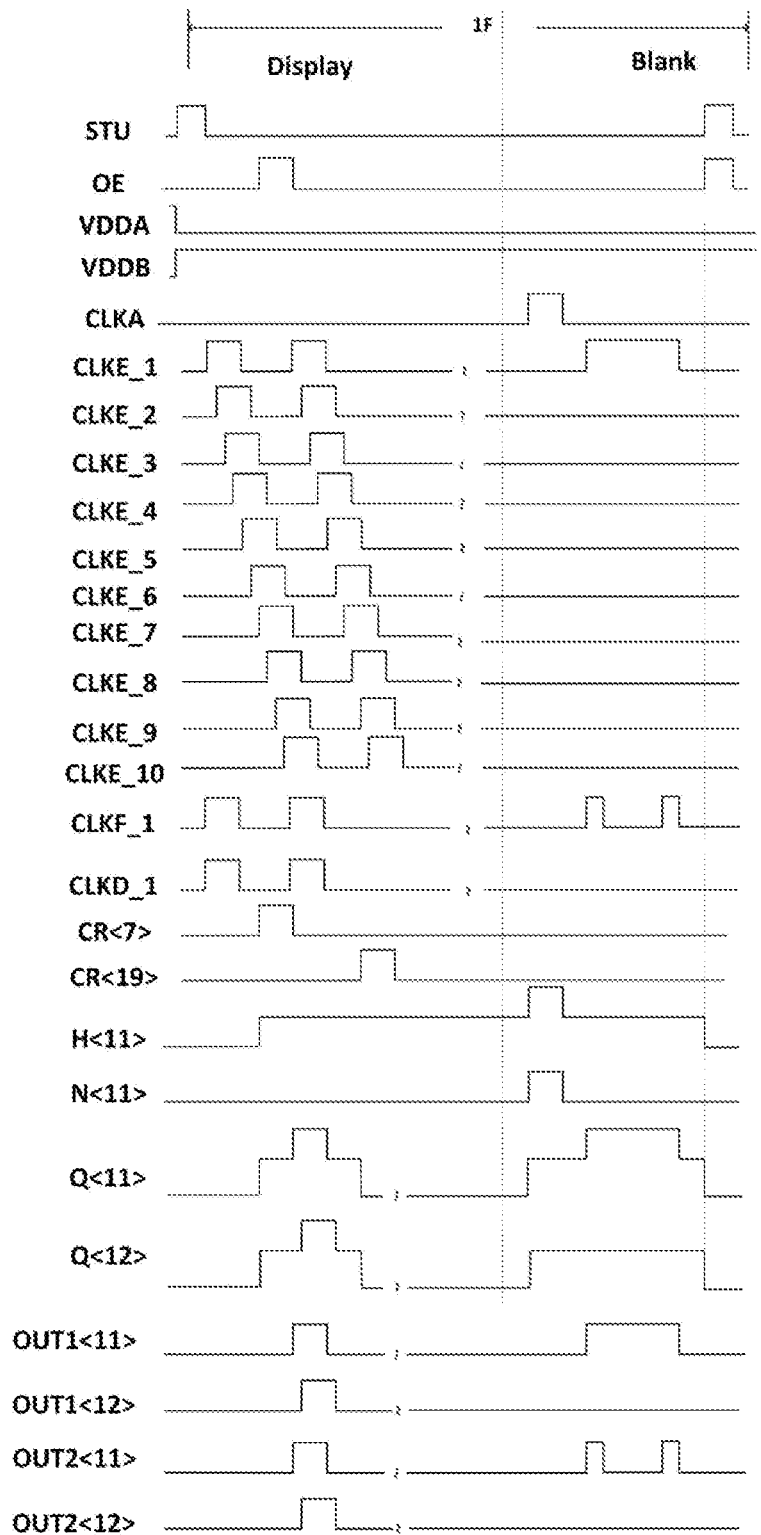
FIG. 4 shows a timing diagram of the embodiment in FIG. 3.

In the phase B, the cascaded outputting terminal CR<N−4> of the shift register unit in the previous fourth stage from the first register unit is at a high potential, that is, CR<7> in FIG. 4 is at a high potential. The fifth controlling terminal OE is at a high potential. The cascaded outputting terminal CR<N+8> of the shift register unit in the subsequent eighth stage from the first register unit is at a low potential, that is, CR<19> in FIG. 4 is at a low potential. Furthermore, the second controlling terminal STD is at a low potential, and the fourth controlling terminal TRST, the third controlling terminal CLKA, the fifth clock terminal CLKD (that is, CLKD_1), the first clock terminal CLKEA (that is, CLKE_1), the second clock terminal CLKFA (that is, CLKF1_1), the third clock terminal CLKEB (CLKE_2) and the fourth clock terminal CLKFB (the same as CLKE_2) are all at low potentials. One of VDDA and VDDB always keeps at a high potential and the other is at a low potential.

CR<7> is at a high potential, so that the twenty-seventh transistor M27 and the twenty-eighth transistor M28 are turned on, and the first pulling-up node Q1 and the second pulling-up node Q2 are written into a high voltage and maintained at a high potential. Then, th gates of the twenty-ninth transistor M29, the fifth transistor M5, the sixth transistor M6, the thirteenth transistor M13, and the fourteenth transistor M14 are set to a high potential. The first pulling-up node Q1 and the second pulling-up node Q2 are at high potentials. Thus, the sixteenth transistor M16 and the eighteenth transistor M18 are turned on, and then the first pulling-down node QB1 and the second pulling-down node QB2 are pulled down to a low potential. The fifth clock terminal CLKD, the first clock terminal CLKEA, the second clock terminal CLKFA, the third clock terminal CLKEB, and the fourth clock terminal CLKFB are at low potentials, so that the cascaded outputting terminal CR<11>, the first outputting terminal OUT1<11> and OUT1<12>, and the second outputting terminal OUT2<11> and OUT2<12> are at low potentials. Moreover, the high potential of CR<7> also enables the twenty-third transistor M23 to be turned on, and the predetermined node H to be written into a high voltage and maintained at the high potential.

In the phase C, the fifth clock terminal CLKD, the first clock terminal CLKEA, and the second clock terminal CLKFA are all at high potentials. The cascaded outputting terminal CR<N−4> of the shift register unit in the previous fourth stage from the first register unit is at a low potential, that is, CR<7> in FIG. 4 is at a low potential. Then, the first controlling terminal STU and the fifth controlling terminal OE are at low potentials. The cascaded outputting terminal CR<N+8> of the shift register unit in the subsequent eighth stage from the first register unit is at a low potential, that is, CR<19> in FIG. 4 is at a low potential. Then, the second controlling terminal STD is at a low potential, and the fourth controlling terminal TRST, the third controlling terminal CLKA, the third clock terminal CLKEB (that is, CLKE_2), and the fourth clock terminal CLKFB (the same as CLKE_2) are at low potentials.

The first pulling-up node Q1 is maintained at a high potential due to the presence of the second capacitor C2 and the third capacitor C3. The twenty-ninth transistor M29, the fifth transistor M5, and the sixth transistor M6 are turned on. The fifth clock terminal CLKD, the first A clock terminal CLKEA and a second clock terminal CLKFA are at high potentials, so that the cascaded outputting terminal CR<11>, the first outputting terminal OUT1<11>, and the second outputting terminal OUT2<11> output at high potentials.

In the phase D, the third clock terminal CLKEB and the fourth clock terminal CLKFB become high.

The second pulling-up node Q2 is maintained at a high potential due to the presence of the fourth capacitor C4 and the fifth capacitor C5. The thirteenth transistor M13 and the fourteenth transistor M14 are turned on, and the third clock terminal CLKEB and the fourth clock terminal CLKFB are at high potentials, so that the second pulling-up node Q2 implements a second bootstrap to further increase the potential. The first outputting terminal OUT1<12> and the second outputting terminal OUT2<12> output at high potentials.

In the phase E, the fifth clock terminal CLKD, the first clock terminal CLKEA, and the second clock terminal CLKFA become low.

At this time, the first pulling-up node Q1 is maintained at a high level due to the presence of the second capacitor C2 and the third capacitor C3. The fifth clock terminal CLKD, the first clock terminal CLKEA, and the second clock terminal CLKFA are at low levels, so that the cascaded outputting terminal CR<11>, the first outputting terminal OUT1<11>, and the second outputting terminal OUT2<11> output at low potentials.

In the phase F, the third clock terminal CLKEB and the fourth clock terminal CLKFB become low.

At this time, the second pulling-up node Q2 is maintained at a high level due to the presence of the fourth capacitor C4 and the fifth capacitor C4. The third clock terminal CLKEB and the fourth clock terminal CLKFB are at low levels, so that the first outputting terminal OUT1<12> and the second outputting terminal OUT2<12> output at low potentials.

In the phase G, CR<N+8> (CR<19>) is at a high potential, that is, the second controlling terminal STD is at a high potential.

At this time, CR<19> is at a high potential, so that the nineteenth transistor M19 and the twentieth transistor M20 are turned on, and the first pulling-up node Q1 and the second pulling-up node Q2 are pulled down, thereby completing the resetting.

In addition, the first pulling-up node Q1 and the second pulling-up node Q2 are pulled down, so that the sixteenth transistor M16 and the eighteenth transistor M18 are turned off, and the second pulling-down node QB2 becomes high. Then, the second transistor M2, the eighth transistor M8, the tenth transistor M10, and the twelfth transistor M12 are turned on, and the first pulling-up node Q1, the second pulling-up node Q2, the cascaded outputting terminal CR, the first outputting terminals OUT1<N> and OUT1<N+1>, and the second outputting terminals OUT2<N> and OUT2<N+1> are all pulled by the third power supply VGL1 of the low potential and maintained at low potentials.

Such operations are shifted sequentially, to complete the displaying of all the rows in the displaying phase. Then, the displaying phase ends, and is followed by the Blank phase.

Therefore, in the embodiment of FIG. 3, two pulling-down tubes can be saved by sharing the last two rows of the structure. Since the size of the pulling-down tube is relatively large, a large space is saved.

It should be noted that in this process, for the SENSE in the 11$^{th}$ row, the fifth control signal from the fifth controlling terminal OE is the same as the waveform and the pulse width of CR<7>. Thus, when CR<7> is output, the pre-stored node H of the shift register unit in the 11$^{th}$ stage will be charged. After the fifth controlling terminal OE becomes low, the high potential at the pre-stored node H of the shift register unit in the 11$^{th}$ stage will be maintained until the Blank phase. In addition, during this process, the twenty-fifth transistor M25 and the twenty-sixth transistor M26 are always turned off, isolating the impact of the SENSE pre-stored node H on the process during displaying phase.

In the sensing mode, that is, during the Blank phase of a certain frame, the specific working process for the shift register unit in the 11$^{th}$ stage is as follows:

In the phase R, the third controlling terminal CLKA is at a high potential, and CR<N−4> (CR<7>) is at a low potential. Then the first controlling terminal STU and the fifth controlling terminal OE are at low potentials. CR<N+8> (CR<11>) is at a low potential, that is, the second controlling terminal STD is low. The fourth controlling terminal TRST, the fifth clock terminal CLKD, the first clock terminal CLKEA (that is, CLKE_1), the second clock terminal CLKFA (as same as CLKE_1), the third clock terminal CLKEB (that is, CLKE_2) and the fourth clock terminal CLKFB (as same as CLKE_2) are low.

At this time, the third controlling terminal CLKA is at a high potential, and the pre-stored node H is also at a high potential, so that the twenty-fourth transistor M24 is turned on, and outputs the high potential of the third controlling terminal CLKA to the common node N. The high potential of the third controlling terminal CLKA also turns on the twenty-fifth transistor M25 and the twenty-sixth transistor M26, and the high potential at the common node N is further output to the first pulling-up node Q1 and the second pulling-up node Q2. The first pulling-up node Q1 and the second pulling-up node Q2 become high.

In the phase S, the first clock terminal CLKEA and the second clock terminal CLKFA are at high potentials, the third controlling terminal CLKA is at a low potential, CR<N−4> (CR<7>) is at a low potential. Thus, the first controlling terminal STU and the fifth controlling terminal OE are at low potentials, CR<N+8> (CR<19>) is at a low potential, that is, the second controlling terminal STD is at a low potential. The fourth controlling terminal TRST, the fifth clock terminal CLKD, the third clock terminal CLKEB (that is, CLKE_2), and the fourth clock terminal CLKFB (as same as CLKE_2) are all low.

At this time, the first pulling-up node Q1 is maintained at a high potential due to the presence of the second capacitor C2 and the third capacitor C3. The fifth transistor M5 and the sixth transistor M6 are turned on, and the first clock terminal CLKEA and the second clock terminal CLKFA are at high potentials, so that the first pulling-up node Q1 performs a bootstrap to further increase the potential. The first outputting terminal OUT1<11> and the second outputting terminal OUT2<11> output at high potentials.

In the phase T, the first clock terminal CLKEA and the second clock terminal CLKFA become low.

The first clock terminal CLKEA and the second clock terminal CLKFA become low, and the first outputting terminal OUT1<11> and the second outputting terminal OUT2<11>output at low potentials.

In summary, according to the shift register of the embodiments of the present disclosure, a plurality of shift register units share the first pulling-down circuit, and the first outputting terminal of each shift register unit is further connected to the first pulling-down circuit via the first unidirectional isolating circuit, and the second outputting terminal of each shift register unit is also connected to the first pulling-down circuit via the second unidirectional isolating circuit, so that the first outputting terminal and the second outputting terminal of each shift register unit are isolated from each other, thereby simplifying the circuit structure, saving the occupied space, and meeting the requirements for the high-resolution and the narrow benzel.

Based on the shift register of the above embodiment, the present disclosure also proposes a gate driving circuit.

Figure 5:
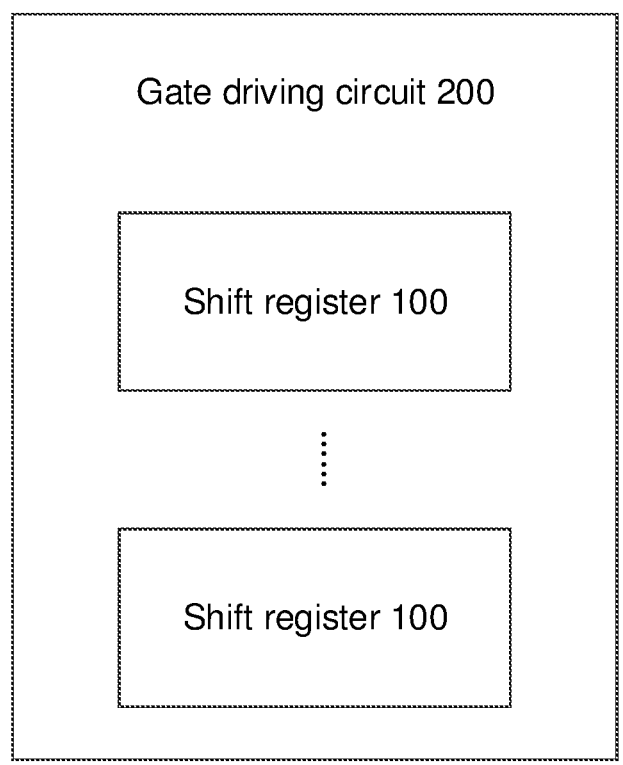
FIG. 5 shows a block diagram illustrating a gate driving circuit according to an embodiment of the present disclosure.

FIG. 5 shows a block diagram illustrating a gate driving circuit according to an embodiment of the present disclosure. As shown in FIG. 5, the gate driving circuit 200 comprises a plurality of shift registers 100 according to the foregoing embodiment.

Figure 6:
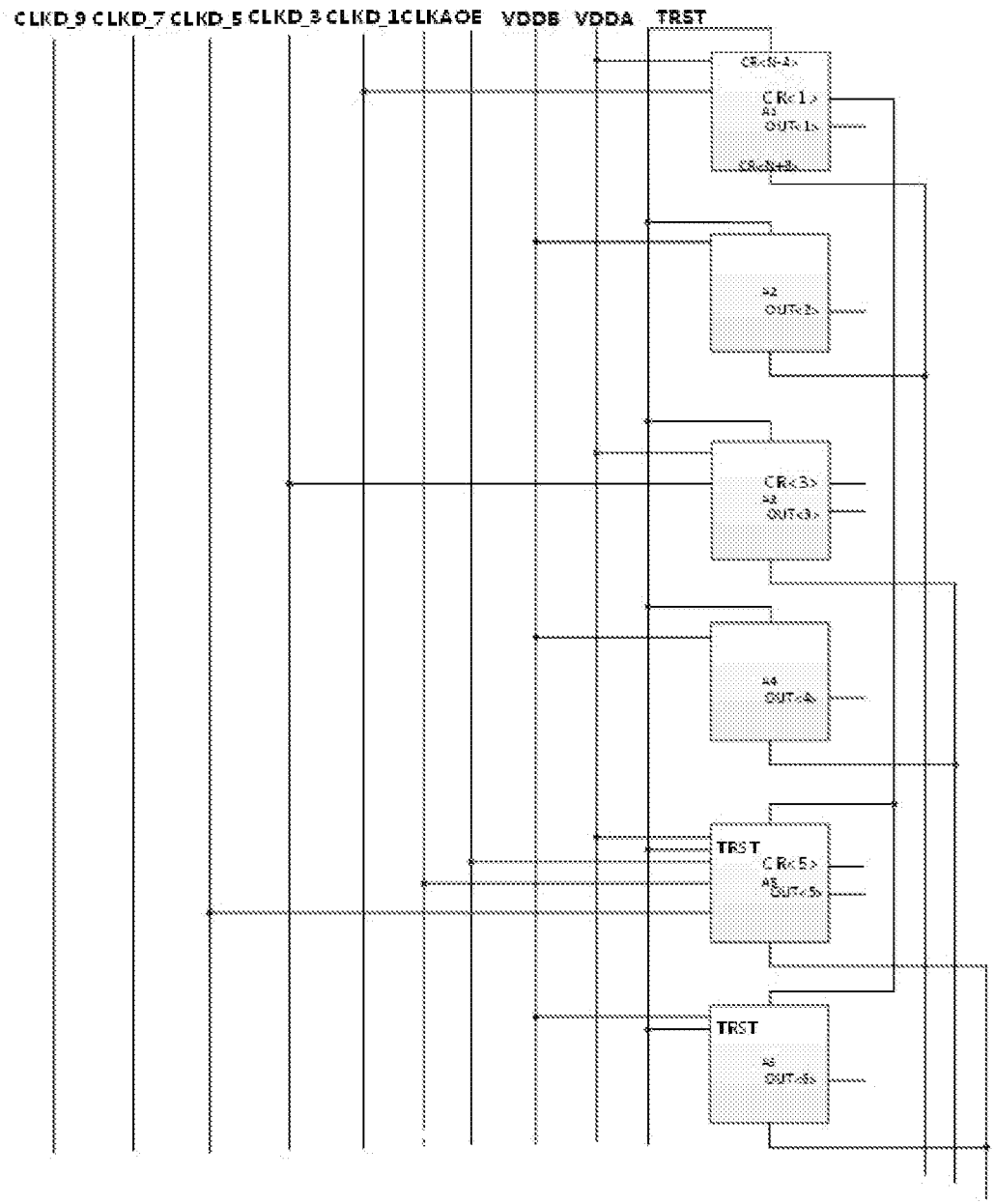
FIG. 6 shows a schematic diagram illustrating the cascading of gate driving circuits according to an embodiment of the present disclosure.

Specifically, each of the shift registers 100 comprises a first shift register unit and a second shift register unit. The first shift register unit is located in an odd stage, and the second shift register unit is located at an even stage. The cascaded relationship of the shift register unit in first six stages can be shown in FIG. 6. The shift register unit in the first stage, the shift register unit in the second stage, the shift register unit in the third stage, the shift register unit in the fourth stage, the shift register unit in the fifth stage, and the shift register unit in the sixth stage are arranged from top to bottom. The fourth controlling terminal of the shift register unit in the first stage, the fourth controlling terminal of the shift register unit in the second stage, the fourth controlling terminal of the shift register unit in the third stage, the fourth controlling terminal of the shift register unit in the fourth stage, the fourth controlling terminal of the shift register unit in the fifth stage, and the fourth controlling terminal of the shift register unit in the sixth stage are all coupled to the same TRST signal line. The shift register unit in the first stage, the shift register unit in the third stage, and the shift register unit in the fifth stage are coupled to the first power supply VDDA. The shift register unit in the second stage, the shift register unit in the fourth stage, and the shift register unit in the sixth stage are coupled to the second power supply VDDB. The fifth controlling terminal of the shift register unit in the fifth stage is coupled to the OE signal line; the third controlling terminal of the shift register unit in the fifth stage is coupled to the CLKA signal line. The fifth clock terminal CLKD of the shift register unit in the first stage is coupled to the CLKD_1 clock line, the fifth clock terminal CLKD of the shift register unit in the third stage is coupled to the CLKD_3 clock line, and the fifth clock terminal CLKD of the shift register unit in the fifth stage is coupled to the CLKD_5 clock line. The cascaded outputting terminal of the shift register unit in the first stage is coupled to the first controlling terminals STU of the shift register units in the fifth stage and in the sixth stage.

According to the gate driving circuit of the embodiment of the present disclosure, it is possible to simplify the structure of the circuit, save the occupied space, and meet the requirements for the high-resolution and the narrow benzel.

Based on the gate driving circuit of the above embodiment, the present disclosure also proposes a display panel.

Figure 7:
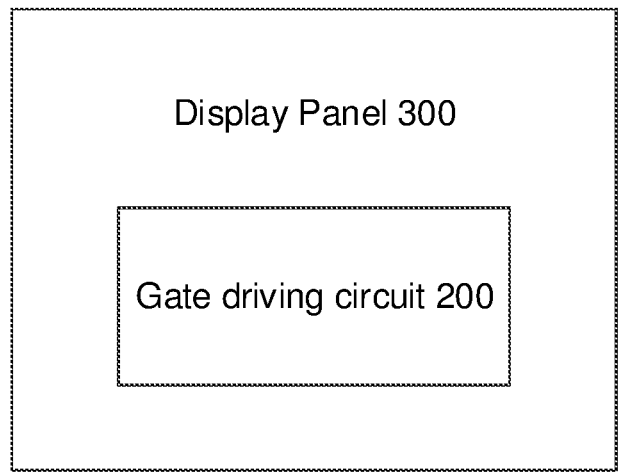
FIG. 7 shows a block diagram illustrating a display panel according to an embodiment of the present disclosure.

FIG. 7 shows a block diagram illustrating a display panel according to an embodiment of the present disclosure. As shown in FIG. 7, the display panel 300 of the embodiment of the present disclosure comprises the gate driving circuit 200 of the abovementioned embodiments.

According to the display panel of the embodiment of the present disclosure, it is possible to simplify the structure of the circuit, save the occupied space, and meet the requirements for the high-resolution and the narrow benzel.

Corresponding to the shift register of the foregoing embodiment, the present disclosure also proposes a method for driving the shift register.

Figure 8:
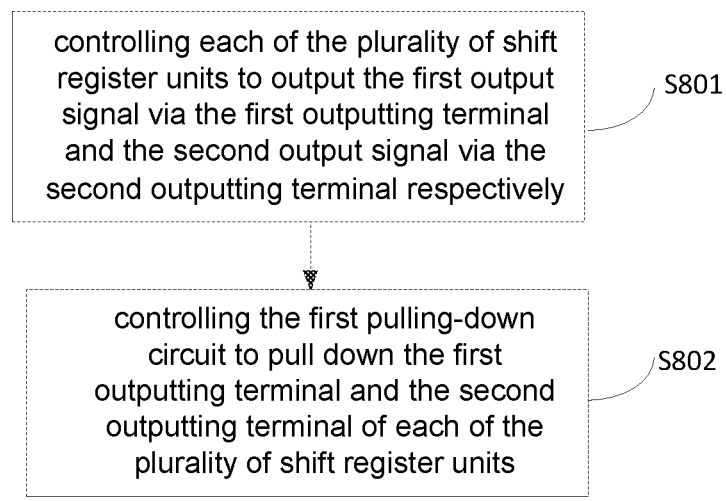
FIG. 8 shows a flowchart diagram of a method for driving the shift register according to an embodiment of the present disclosure.

FIG. 8 shows a flowchart diagram of a method for driving the shift register according to an embodiment of the present disclosure. The shift register comprises a plurality of shift register units, which share a first pulling-down circuit. Each shift register unit further comprises a first outputting circuit and a second outputting circuit. The first outputting circuit of each shift register unit is electrically coupled to the first outputting terminal of the corresponding shift register unit, and the second outputting circuit of each shift register unit is electrically coupled to the second outputting terminal of the corresponding shift register unit. The first outputting terminal of each shift register is also connected to the first pulling-down circuit through the first unidirectional isolating circuit, and the second outputting terminal of each shift register is also connected to the first pulling-down circuit through the second unidirectional isolating circuit, so that the first outputting terminal and the second outputting terminal are isolated from each other. As shown in FIG. 8, the method for driving the shift register comprises:

in S801, controlling each of the plurality of shift register units to output the first output signal via the first outputting terminal and the second output signal via the second outputting terminal respectively; and in S802, controlling the first pulling-down circuit to pull down the first outputting terminal and the second outputting terminal of each of the plurality of shift register units.

It should be noted that the foregoing explanation of the embodiment of the shift register is also applicable to the method for driving the shift register of this embodiment, which are not described herein again.

According to the method for driving the shift register of the embodiment of the present disclosure, the first outputting terminals and the second outputting terminals of a plurality of shift register units are respectively controlled to output, and the first pulling-down circuit is controlled to pull down the first outputting terminals and the second outputting terminals. Thus, the pluraltiy of shift register units may share the first pulling-down circuit, which can simplify the circuit structure, save the occupied space, and meet the requirements for the high-resolution and the narrow benzel.

In the description of this specification, the description with reference to the terms "one embodiment", "some embodiments", "examples", "specific examples", or "some examples" and the like means that specific features, structure, material, or characteristic described in conjunction with the embodiments or examples may be included in at least one embodiment or example of the present disclosure. In this specification, the schematic expressions of the above terms are not necessarily directed to the same embodiment or example. Moreover, the particular features, structures, materials, or characteristics described may be combined in any suitable manner in one or more embodiments or examples. In addition, those skilled in the art may combine and integrate different embodiments or examples, and features of the different embodiments or examples described in this specification without conflicting.

In addition, the terms such as "first" and "second" are used for descriptive purposes only, and cannot be understood as indicating or implying relative importance or implicitly indicating the number of technical features indicated. Therefore, the features defined by the term of "first" and "second" may explicitly or implicitly include at least one of the features. In the description of the present disclosure, the meaning of "a plurality of" is at least two, for example, two, three, etc., unless otherwise defined.

It should be understood that any process or method in a flowchart or otherwise described herein can be referred to a module, fragment, or a portion comprising codes that include one or more executable instructions for implementing steps of a custom logic function or process. Further, it should be understood, by those skilled in the art to which the embodiments of the present disclosure belong, that the scope of the preferred embodiments of the present disclosure comprises other implementations, in which functions may be performed out of the shown or discussed order, such as, the functions may be performed in a substantially simultaneous manner or in the reverse order according to the functions involved.

Although the embodiments of the present disclosure have been shown and described above, it can be understood that the above embodiments are exemplary and should not be construed as limitations on the present disclosure. Those skilled in the art can understand that various changes, modifications, substitutions, and variation can be made to the foregoing embodiments within the scope of the present disclosure.

We claim:

1. A shift register, comprising:
a plurality of shift register units; and
a first pulling-down circuit,
wherein each of the plurality of shift register units comprises:
   a first outputting circuit electrically coupled to a first outputting terminal;
   a second outputting circuit electrically coupled to a second outputting terminal;
   a first unidirectional isolating circuit configured to connect the first outputting terminal with the first pulling-down circuit; and
   a second unidirectional isolating circuit configured to connect the second outputting terminal with the first pulling-down circuit;
   wherein the first unidirectional isolating circuit and the second unidirectional isolating circuit are configured such that the first outputting terminal and the second outputting terminal are electrically isolated from each other.

2. The shift register of claim 1, wherein the plurality of shift register units comprise a first shift register unit and a second shift register unit, wherein:
the first outputting circuit of the first shift register unit is configured to control the first outputting terminal of the first shift register unit to output a first output signal according to a potential at a first pulling-up node and a first clock signal from a first clock terminal; and the second outputting circuit of the first shift register unit is configured to control the second outputting terminal of the first shift register unit to output a second output signal according to the potential at the first pulling-up node and a second clock signal from a second clock terminal; and
the first outputting circuit of the second shift register unit is configured to control the first outputting terminal of the second shift register unit to output a third output signal according to a potential at a second pulling-up node and a third clock signal from a third clock terminal; and the second outputting circuit of the second shift register unit is configured to control the second outputting terminal of the second shift register unit to output a fourth output signal according to the potential at the second pulling-up node and a fourth clock signal from a fourth clock terminal.

3. The shift register of claim 2, wherein:
the first shift register unit further comprises a first controlling circuit configured to apply a first power supply voltage to a first pulling-down node, or pull down a potential at the first pulling-down node to a third power supply voltage, under a control of the potential at the first pulling-up node; and
the second shift register unit further comprises a second controlling circuit configured to apply a second power supply voltage to a second pulling-down node, or pull down a potential at the second pulling-down node to the third power supply voltage, under a control of the potential at the second pulling-up node,
wherein the first pulling-down circuit is electrically coupled to the first pulling-down node via a first controlling terminal, and electrically coupled to the second pulling-down node via a second controlling terminal.

4. The shift register of claim 3, wherein the first shift register unit further comprises:

a cascaded outputting circuit configured to control a cascaded outputting terminal to output a cascaded output signal according to the potential at the first pulling-up node and a fifth clock signal from a fifth clock terminal; and a second pulling-down circuit electrically coupled to the first pulling-down node via a third controlling terminal, and electrically coupled to the second pulling-down node via a fourth controlling terminal, wherein the second pulling-down circuit is configured to pull down the potential of the cascaded outputting terminal under the control of the potential at the first pulling-down node or the potential at the second pulling-down node.

5. The shift register of claim 3, wherein:

the first shift register unit further comprises a third pulling-down circuit configured to initialize the first pulling-up node under the control of the potential at the first pulling-down node and the potential at the second pulling-down node; and the second shift register unit further comprises a fourth pulling-down circuit configured to initialize the second pulling-up node under the control of the potential at the first pulling-down node and the potential at the second pulling-down node.

6. The shift register of claim 5, wherein:

the third pulling-down circuit comprises a seventh transistor and an eighth transistor, a first electrode of the seventh transistor being electrically coupled to a first electrode of the eighth transistor and the first pulling-up node, a second electrode of the seventh transistor being electrically coupled to a second electrode of the eighth transistor and a third power supply voltage terminal, a controlling electrode of the seventh transistor being electrically coupled to the first pulling-down node, and a controlling electrode of the eighth transistor being electrically coupled to the second pulling-down node; and the fourth pulling-down circuit comprises a ninth transistor and a tenth transistor, a first electrode of the ninth transistor being electrically coupled to a first electrode of the tenth transistor and the second pulling-up node, a second electrode of the ninth transistor being electrically coupled to a second electrode of the tenth transistor and the third power supply voltage terminal, a controlling electrode of the ninth transistor being electrically coupled to the first pulling-down node, and a controlling electrode of the tenth transistor being electrically coupled to the second pulling-down node.

7. The shift register of claim 5, wherein the second pulling-down circuit comprises an eleventh transistor and a twelfth transistor, a first electrode of the eleventh transistor being electrically coupled to a first electrode of the twelfth transistor and the cascaded outputting terminal, a second electrode of the eleventh transistor being electrically coupled to a second electrode of the twelfth transistor and a third power supply voltage terminal, a controlling electrode of the eleventh transistor being electrically coupled to the first pulling-down node, and a controlling electrode of the twelfth transistor being electrically coupled to the second pulling-down node.

8. The shift register of claim 3, wherein the first shift register unit further comprises:

a first inputting circuit configured to apply a fourth power supply voltage to the first pulling-up node under a control of a first control signal from the first controlling terminal; and a first resetting circuit configured to reset the first pulling-up node with the third power supply voltage under a control of a second control signal from the second controlling terminal, and wherein the second shift register unit further comprises:

a second inputting circuit configured to apply the fourth power supply voltage to the second pulling-up node under the control of the first control signal; and a second resetting circuit configured to reset the second pulling-up node with the third power supply voltage under the control of the second control signal.

9. The shift register of claim 3, wherein the first shift register unit further comprises a first sensing controlling circuit configured to apply, in a displaying mode, the fourth power supply voltage to a predetermined node, under a fifth control signal from a fifth controlling terminal, and control, in a sensing mode, the potential at the first pulling-up node according to the potential at the predetermined node and a third control signal from a third controlling terminal, so as to enable the first outputting circuit and the second outputting circuit of the first shift register unit to output a first sensing control signal and a second sensing control signal respectively; and wherein the second shift register unit further comprises a second sensing controlling circuit configured to control, in the sensing mode, the potential at the second pulling-up node according to the third control signal from the third controlling terminal, so as to enable the first outputting circuit and the second outputting circuit of the second shift register unit to output a third sensing control signal and a fourth sensing control signal respectively.

10. The shift register of claim 3, wherein the first pulling-down circuit comprises a first transistor and a second transistor, a first electrode of the first transistor and a first electrode of the second transistor being electrically coupled to the first unidirectional isolating circuit and the second unidirectional isolating circuit of each shift register unit, a second electrode of the first transistor being electrically coupled to a second electrode of the second transistor, a controlling electrode of a first transistor being electrically coupled to the first pulling-down node, and a controlling electrode of the second transistor being electrically coupled to the second pulling-down node.

11. The shift register of claim 1, wherein:

the first unidirectional isolating circuit comprises a third transistor, a first electrode of the third transistor being electrically coupled to a controlling electrode of the third transistor and the first outputting terminal of the shift register unit, and a second electrode of the third transistor being electrically coupled to the first pulling-down circuit; and the second unidirectional isolating circuit comprises a fourth transistor, a first electrode of the fourth transistor being electrically coupled to a controlling electrode of the fourth transistor and the second outputting terminal of the shift register unit, and a second electrode of the fourth transistor being electrically coupled to the first pulling-down circuit.

12. A gate driving circuit comprising a plurality of shift registers of claim 1.

13. A display panel comprising the gate driving circuit of claim 12.

14. A method for driving the shift register of claim 1, wherein the shift register comprises the plurality of shift register units which share the first pulling-down circuit, the method comprising:

controlling each of the plurality of shift register units to output the first output signal via the first outputting terminal and the second output signal via the second outputting terminal respectively; and controlling the first pulling-down circuit to pull down the potential of the first outputting terminal and the potential of the second outputting terminal of each of the plurality of shift register units.

* * * * *